United States Patent

Beardsley et al.

(12) United States Patent
(10) Patent No.: US 6,269,510 B1
(45) Date of Patent: Aug. 7, 2001

(54) POST CMP CLEAN BRUSH WITH TORQUE MONITOR

(75) Inventors: Gary Joseph Beardsley, Underhill; Timothy Scott Bullard, Johnson; Cuc Kim Huynh, Jericho, all of VT (US); Theodore Gerard van Kessel, Millbrook, NY (US); David Louis Walker, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,073

(22) Filed: Jan. 4, 1999

(51) Int. Cl.[7] .............................. A46B 13/04; A46B 13/02
(52) U.S. Cl. .................................. 15/77; 15/88.2; 15/102
(58) Field of Search .............................. 15/21.1, 77, 88.2, 15/97.1, 102, 88.3; 134/6, 902; 451/8, 10, 11, 285, 287, 288, 289

(56) References Cited

U.S. PATENT DOCUMENTS

| | | | |
|---|---|---|---|
| Re. 34,425 | 11/1993 | Schultz | 51/165.74 |
| 4,382,308 | * 5/1983 | Curcio | 15/77 |
| 4,524,477 | 6/1985 | Williams, III et al. | 15/50.1 |
| 4,561,214 | 12/1985 | Inoue | 15/104.14 |
| 4,757,566 | 7/1988 | Field et al. | 15/49.1 |
| 5,012,526 | * 5/1991 | Romans et al. | 15/823 |
| 5,036,015 | 7/1991 | Sandhu et al. | 51/165 R |
| 5,069,002 | 12/1991 | Sandhu et al. | 51/165 R |
| 5,308,438 | 5/1994 | Cote et al. | 156/636 |
| 5,475,889 | * 12/1995 | Thrasher et al. | 15/77 |
| 5,498,196 | 3/1996 | Karlsrud et al. | 451/11 |
| 5,499,733 | 3/1996 | Litvak | 216/38 |
| 5,636,401 | * 6/1997 | Yonemizu et al. | 15/77 |
| 5,860,178 | * 1/1999 | Nishimura et al. | 15/77 |
| 6,115,867 | * 9/2000 | Nakashima et al. | 15/77 |
| 6,119,294 | * 9/2000 | Lai et al. | 15/77 |

OTHER PUBLICATIONS

Myers, T.L. "Post–tungsten CMP cleaning: Issues and Solutions" Solid State Technology (Oct. 1995) pp. 59–60, 63–64.

* cited by examiner

*Primary Examiner*—Gary K. Graham
(74) *Attorney, Agent, or Firm*—DeLio & Peterson, LLC; Kelly M. Reynolds; Howard J. Walter, Jr.

(57) ABSTRACT

An apparatus for and method of detecting the presence of a brush used in a semiconductor wafer cleaner for post-CMP processing is described. Semiconductor wafers are loaded into the wet environment of the wafer cleaner, affixed to a rotatable fixture and rotated at high speed. The rotatable fixture is effectuated by a servo motor linked to a servo controller and a torque monitor. A first torque on the rotating wafer is calculated prior to the start of the brush cleaning cycle. During the brush cleaning cycle, as the brush within the brush cleaner contacts the rotating wafer, the torque on the wafer increases and a second torque is calculated. If, during the brush cleaning cycle, the second torque calculation is substantially equal to the first torque calculation, the brush cleaner is not contacting the wafer and cleaning has not progressed. A tool user can be notified to reaffix the brush within the cleaner. When the second torque calculation is greater than expected, the tool user can be notified that the brush downforce has been improperly set. Inadequate removal of CMP residue is detected before entire wafer lots have passed through an ineffective brush cleaning cycle prior to an inspection point.

17 Claims, 2 Drawing Sheets

POST CMP CLEAN BRUSH WITH TORQUE MONITOR

BACKGROUND OF THE INVENTION

1. Field of the Invention

This invention relates, in general, to the field of semiconductor manufacture. In particular, it relates to monitoring the conditions of post chemical mechanical polishing processing.

2. Description of Related Art

Fabrication of semiconductor integrated circuits (IC) is a complicated multi-step process for creating microscopic structures with various electrical properties to form a connected set of devices. As the level of integration of ICs increases, the devices become smaller and more densely packed, requiring more levels of photolithography and more processing steps. As more layers are built up on the silicon wafer, problems caused by surface non-planarity become increasingly severe and can impact yield and chip performance. During the fabrication process, it may become necessary to remove excess material in a process referred to as planarization.

A common technique used to planarize the surface of a silicon wafer is chemical mechanical polishing (CMP). CMP involves the use of a polishing pad affixed to a circular polishing table and a holder to hold the wafer face down against the rotating pad. A slurry containing abrasive and chemical additives are dispensed onto the polishing pad.

The wafer and polishing pad rotate relative to each other. The rotating action along with the abrasive and chemical additives of the slurry results in a polishing action that removes material from the surface of the wafer. Protrusions on the surface erode more efficiently than recessed areas leading to a flattening or planarization of the wafer surface. Following CMP, the wafer must be cleaned of any CMP and slurry residue. Any residue remaining on the wafer can cause shorts to the IC devices.

A known method of post-CMP processing in the prior art utilizes brush cleaning technology such as the Dai Nippon Screen Model No. SP-W813-AS (DNS brush cleaner). The DNS brush cleaner cleans the wafer using a combination of rinsing, megasonic rinsing, and brush cleaning.

The wafers are loaded into a wet environment, usually water, then transported through a series of cleaning chambers for the brush cleaning cycle. The brush cleaning cycle involves rotating the wafer at high speed, about 1500 rpm, while a jet of deionized water is sprayed on the wafer to dislodge any loose debris from CMP, and the wafer is brushed with a foam brush.

During the brush cleaning cycle, the brush is first placed over the center of the wafer. The brush contacts the backside of the wafer, presses down on the wafer, and moves at a constant height and pressure to the periphery of the wafer in one stroke. The brush then retracts from the wafer and the whole cycle is repeated. The following chamber then brushes the top side of the wafer. After the brushing cycles, the wafer is deposited in the spin/rinse/dry chamber and unloaded dry.

The problem associated with the DNS brush cleaner is the inability of the machine to recognize whether the brush has fallen off and is not making contact with the wafer. A tool user cannot actually see that the brush has fallen off the brush holder since the cleaning process is within an enclosed chamber. Also problems arise when the brush's contact pressure is improperly set during maintenance set up or during the brush cleaning cycle. The silent failure of the brush to properly clean the wafer is difficult to detect until the next inspection point. At that time, several wafer lots have gone through the brush cleaner and would require reworking the lots, a costly solution.

U.S. Pat. No. 4,561,214 issued to Inoue on Dec. 31, 1985, discloses a motor driven abrading tool having a sensor to monitor electrical resistance between the contact surfaces of the tool and the object being abraded. As the contact resistance increases with the decrease of the urging pressure of the tool, the current from the electrical source is reduced and the voltage drops. A control circuit responds to the drop in voltage to control the rpm of the abrading tool motor or to control the torque on the tool to change the contact pressure of the tool on the object being abraded. This patent does not disclose or suggest monitoring the torque as a means to detect the presence of the abrading tool but rather as a means to adjust the contact pressure of the tool.

U.S. Pat. No. 4,757,566 issued to Field et al. on Jul. 19, 1988, discloses an automatic tool torque compensator for a surface maintenance machine. Once an operator of the machine determines what level of tool torque is desired, the tool torque compensator automatically maintains the tool torque at the desired setting although the surface maintained may vary in elevation or texture. The tool torque compensator achieves the torque compensation by using an electrical signal representative of current load for the tool motor and a signal representative of the desired level of tool torque and integrates the two signals to raise or lower the surface maintenance tools which change their pressure against the surface being maintained. However, this patent discloses adjusting the contact pressure of the tool on the surface being maintained and does not disclose or suggest using the torque value as an input to detecting the presence of the tool itself.

Bearing in mind the problems and deficiencies of the prior art, it is therefore an object of the present invention to provide a post-CMP brush cleaner for semiconductor wafers having a means for ensuring proper wafer cleaning.

It is another object of the present invention to provide a method of ensuring proper wafer cleaning during post-CMP processing.

A further object of the invention is to provide a method of ensuring proper wafer cleaning during post-CMP processing utilizing a DNS brush cleaner.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a semiconductor wafer cleaning tool comprising a cleaning chamber; a rotatable fixture within the cleaning chamber for securing and rotating a semiconductor wafer during cleaning; a brush cleaner within the cleaning chamber for cleaning a surface of the wafer; and a means for detecting the presence of the brush cleaner during wafer cleaning.

The brush cleaner comprises a rotating brush and a brush arm adapted to move the rotating brush across the surface of the rotating wafer.

The semiconductor wafer cleaning tool further includes a servo motor for rotating the rotatable fixture. The servo motor further includes a servo controller connected to the servo motor. The servo controller interfaces with a processor such that the processor is adapted to detect the absence of the brush cleaner to a tool user based on an output of the servo controller.

The detecting means of the cleaning tool comprises a torque monitor linked to the servo controller to calculate a torque on the rotating wafer. The torque monitor is adapted to determine the presence of the brush cleaner on the rotating wafer during cleaning of the wafer. The presence of the brush cleaner on the rotating wafer during cleaning of the wafer is determined by calculating a torque on the rotating wafer when contacted with the brush cleaner, the torque being greater than a torque on the rotating wafer alone.

The torque monitor sends a signal to the servo controller when the torque on the rotating wafer when contacted with the brush cleaner is substantially equal to the torque on the rotating wafer alone, and the servo controller sends a signal to the servo motor to cease rotating the rotatable fixture. The servo controller sends an analog signal to the torque monitor, the analog signal is converted to a digital signal by the torque monitor.

Alternatively, the detecting means comprises a voltage sensor linked to the servo motor controller to display the voltage of the servo motor. The voltage sensor is adapted to determine the presence of the brush cleaner on the rotating wafer during cleaning of the wafer.

In another aspect, the present invention relates to a post-CMP cleaning tool comprising a cleaning chamber; a rotatable semiconductor wafer fixture within the cleaning chamber for securing and rotating a wafer during cleaning; a motor linked to the rotatable fixture for rotating the fixture; a motor controller linked to the motor; a brush cleaner within the chamber having a rotating brush, and a brush arm adapted to move the rotating brush across a surface of a rotating wafer; a torque monitor linked to the motor controller for detecting the presence of the brush cleaner during wafer cleaning.

The torque monitor of the post-CMP cleaning tool calculates a torque on the rotating wafer. The torque monitor is adapted to determine the absence of the brush cleaner on the rotating wafer during cleaning of the wafer. The torque monitor determines the absence of the brush cleaner on the rotating wafer during cleaning by calculating a torque on the rotating wafer when contacted with the brush cleaner, the torque being greater than a torque on the rotating wafer alone. The torque monitor signals the motor controller when the absence of the brush cleaner is detected, the motor controller sending a signal to the motor to cease rotating the fixture.

In still another aspect, the present invention relates to a method of cleaning a semiconductor wafer following CMP comprising the steps of: (a) providing a semiconductor wafer in need of removing CMP residue; (b) providing a wafer cleaning apparatus having at least one cleaning chamber; a brush cleaner; a wafer rotating device having a motor to rotate the wafer during cleaning; and means for monitoring the presence of the brush cleaner; (c) loading the wafer into the at least one cleaning chamber; (d) rotating the wafer; (e) brushing the rotating wafer with the brush cleaner; and (f) monitoring the presence of the brush cleaner to ensure cleaning of the wafer.

The step of monitoring the presence of the brush cleaner is adapted to measuring the torque on the rotating wafer as the brush cleaner brushes the rotating wafer. Alternatively, the step of monitoring the presence of the brush cleaner is adapted to measuring the voltage on the motor of the wafer rotating device.

In yet another aspect, the present invention relates to the method of monitoring the status of the cleaning process in a semiconductor wafer brush cleaning tool, comprising the steps of: (a) providing a semiconductor wafer in need of cleaning; (b) providing a brush cleaner; (c) rotating the semiconductor wafer; (d) obtaining a first torque on the rotating wafer; (e) contacting the brush cleaner to the rotating wafer; (f) cleaning the rotating semiconductor wafer by moving the brush cleaner over a surface of the wafer; (g) obtaining a second torque on the rotating wafer as the brush cleaner moves over the surface of the rotating wafer; and (h) comparing the first torque and the second torque to determine the presence of the brush cleaner.

The method may further include the step of signaling when the second torque is substantially equal to the first torque. The second torque on the rotating wafer is greater than the first torque when the brush cleaner is in contact with the semiconductor wafer. During the step of obtaining a second torque on the rotating wafer, the second torque is substantially equal to the first torque signifying that the brush cleaner is absent from the surface of the wafer.

The method may further include the step of discontinuing cleaning of the wafer when the brush cleaner is absent from the surface of the wafer.

The step of rotating the wafer is performed by a servo motor. The servo motor is controlled by a servo controller such that the controller regulates rotating of the wafer. During the step of obtaining a second torque on the rotating wafer, wherein the second torque is substantially equal to the first torque, the servo controller sends a signal to the servo motor to cease rotating the wafer.

The servo controller interfaces with a torque monitor adapted to electrically receive analog signals from the servo controller and convert the analog signals to digital signals for further digital signal processing. The digital signal processing includes calculating and comparing torques.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
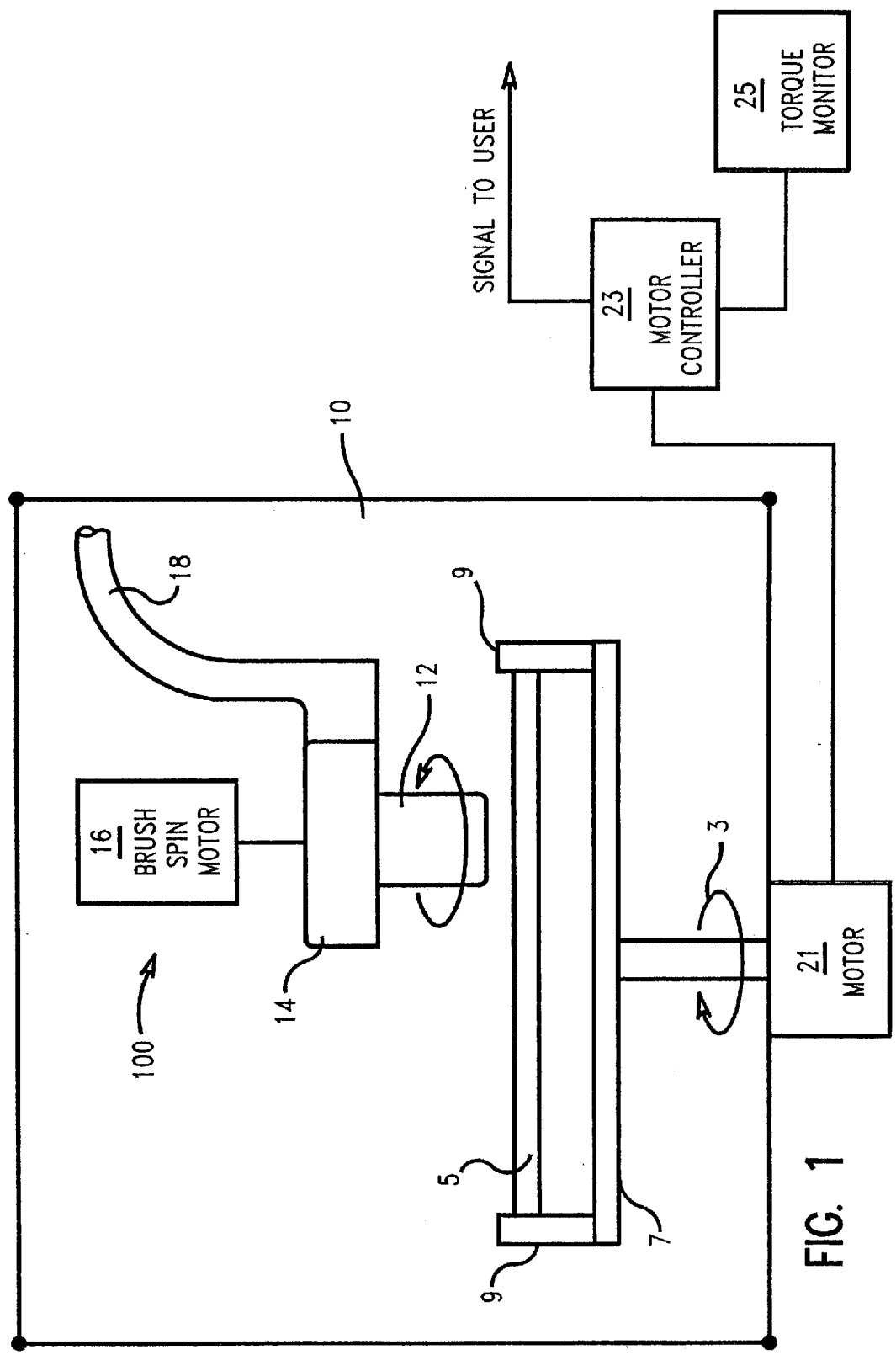
FIG. 1 is an elevated partial schematic view of the brush cleaner in relation to the wafer rotating device.

In describing the preferred embodiment of the present invention, reference will be made herein to FIGS. 1–2B of the drawings in which like numerals refer to like features of the invention. Features of the invention are not necessarily shown to scale in the drawings.

In connection with the instant invention, it has been discovered that during the brush cleaning cycle, the wafer experiences a torque which is directly proportional to the brush friction of the brush against the wafer. At constant spin speed, the torque on the wafer increases as the brush moves radially outward. Cleaning is achieved by the turbulent interaction between the brush and the water surface. If the brush is not making contact with the wafer, the only torque experienced by the wafer is due to air and water friction, and the friction due to the mechanical drive motor. Conversely, when the brush is applied with too much force, the torque excursion during the brush clean cycle is extreme.

FIG. 1 shows a schematic diagram of a brush cleaner in relation to a wafer rotating device which can be used in the present invention. Following CMP, the semiconductor wafers are loaded into a cleaner to remove any CMP residue such as polishing debris and the CMP slurry. It is important to thoroughly remove any CMP residue since failure to do so causes shorts in the ICs manufactured using a wafer having any CMP residue. An example of such a cleaner is the Dai Nippon Screen, Model No. SP-W813-AS (DNS brush cleaner).

The wafers are loaded into a wet environment of the DNS brush cleaner. Inside the cleaning chambers of the DNS brush cleaner, each wafer, such as the wafer 5, is loaded onto a rotatable fixture 7. The wafer 5 is securely attached to fixture 7 with wafer gripping pins 9 and rotated at high speed, about 1500 rpm.

The brush cleaner 100 within the cleaning chamber 10 of the DNS cleaner comprises a brush 12 held in place by brush holder 14. The brush 12 is a foam brush which rotates to clean the wafer 5. Rotation of brush 12 is effectuated by the brush spin motor 16. The brush cleaner further includes a motorized brush arm 18 which moves brush 12 over the surface of wafer 5 during cleaning.

As the wafer is spinning in the direction as shown by arrow 3, a jet of deionized water is sprayed on the wafer to wash off as much CMP residue as possible. Simultaneously, wafer 5 is also contacted with brush 12 to further facilitate cleaning of wafer 5. A more thorough cleaning of the wafer is achieved by the turbulent interaction between brush 12 and the surface of wafer 5. During this brush cleaning cycle, brush arm 18 initially places brush 12 over the center of wafer 5. The brush arm 18 contacts brush 12 with the surface of wafer 5 pressing down onto the center of wafer 5. The brush arm 18 moves brush 12 at a constant height from the center of wafer 5 to the periphery of wafer 5 in one stroke. Brush arm 18 then retracts from the wafer and the cycle is repeated.

The rotation of wafer 5 is effectuated by wafer drive motor 21 attached to rotatable fixture 7. An example of an appropriate wafer drive motor is a servo motor. As the wafer drive motor 21 rotates rotatable fixture 7 with wafer 5 mounted thereon, wafer 5 experiences a torque due to the friction from the air, water environment, and the mechanical drive.

The torque on wafer 5 increases during the brush cleaning cycle. As brush 12 moves radially outward to the periphery of wafer 5, the torque on wafer 5 increases as wafer 5 rotates at a constant spin speed. When brush 12 contacts the surface of wafer 5, wafer 5 experiences a brush torque greater than the torque on the rotating wafer alone. The brush torque is directly proportional to the brush friction of brush 12 against wafer 5. If brush 12 is not making contact with the wafer, the only torque experienced by wafer 5 is due to the friction from the air, water environment and the mechanical drive. Conversely, if brush 12 contacts wafer 5 with too much force, the brush torque on wafer 5 during the brush clean cycle is extreme.

The wafer drive motor is linked to a controller 23, for example, a servo controller. Controller 23 sends out an analog motor torque signal proportional to the torque on the wafer for each wafer undergoing the brush cleaning cycle. Controller 23 is linked to torque monitor 25 which receives the analog signal proportional to the motor torque. Torque monitor 25 converts the analog signal to a digital signal.

During the brush cleaning cycle, when the brush torque falls below the torque of a rotating wafer alone, this signifies that brush 12 is not in contact with rotating wafer 5. A DNS brush cleaner user would then need to check the presence of the brush 12 in brush holder 14. The torque monitor can also signal back to the controller to cease rotation of the wafer when the brush is not detected by the torque monitor. Similarly, when the downforce of the brush is set incorrectly such that the brush is applied to the wafer with too much or too little force, the torque monitor can signal to the controller to cease rotation of the wafer allowing the user to adjust the brush position.

Figure 2:
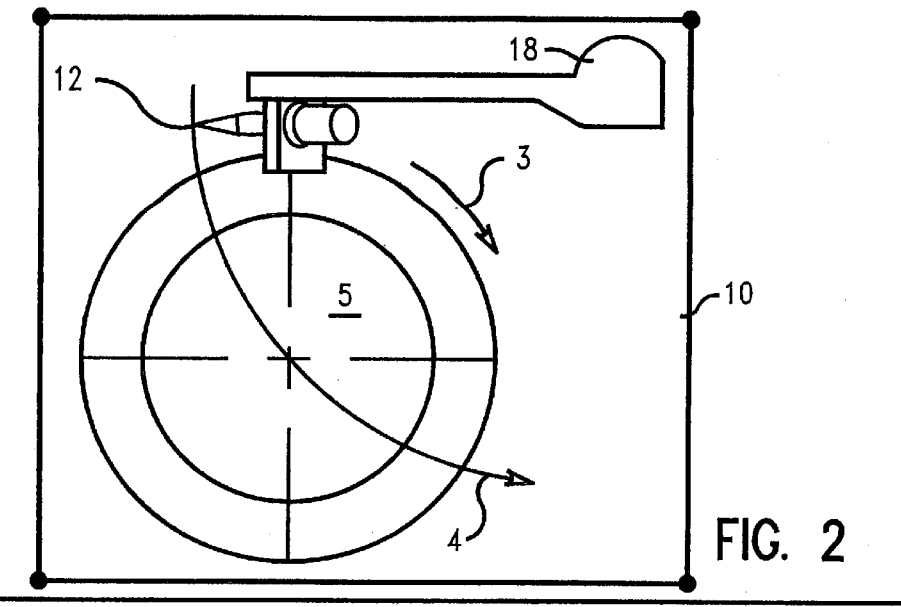
FIG. 2 is a top plan view of the position of the brush cleaner when the brush cleaner is in a rest position just prior to cleaning.
Figure 2A:
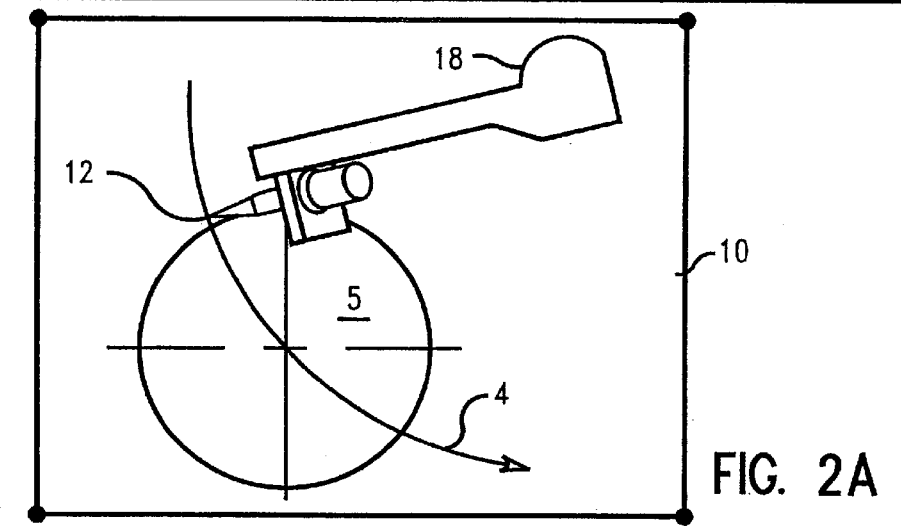
FIG. 2A is a top plan view of the position of the brush cleaner on the edge of the semiconductor wafer as cleaning of the wafer begins.
Figure 2B:
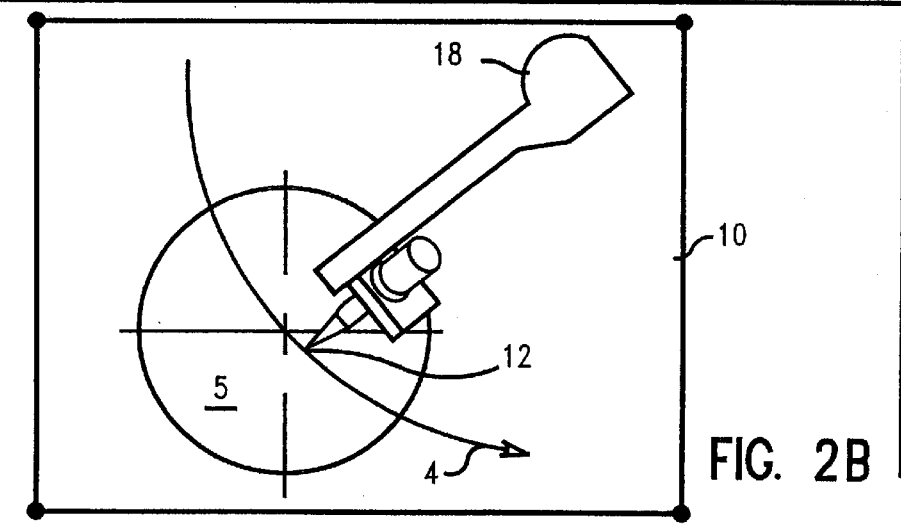
FIG. 2B is a top plan view of the position of the brush cleaner during cleaning of the semiconductor wafer.

FIGS. 2–2B more accurately depict the sweep motion of brush arm 18 as it moves along in the direction of arrow 4 during the brush cleaning cycle. FIG. 2 shows brush arm 18 at a home position prior to commencement of the brush clean cycle. Wafer 5 is mounted onto rotatable fixture 7 (not shown) and is spinning in the direction of arrow 3. At this time point, the only torque on wafer 5 is attributed to air and water within the wet environment of the cleaning chamber, and from the mechanical drive of motor 21.

At the start of the brush clean cycle shown in big. 2A, brush arm 18 positions brush 12 over the center of wafer 5. Contact of brush 12 at a constant height with wafer 5 at the center of the wafer is shown in FIG. 2B. During the brush clean cycle, brush 12 sweeps the surface of wafer 5 in the direction of arrow 4 from the wafer center towards the periphery of wafer 5. As brush 12 moves radially the torque on wafer 5 increases to a maximum when the brush reaches the wafer edge. The brush 12 then retracts back to its home position and the brush cleaning cycle is again activated.

Another embodiment of the present invention would utilize a volt meter in place of torque monitor 25. During the brush cleaning cycle, as brush arm 18 and brush 12 are at the home position the voltage is constant. As brush 12 contacts wafer 5 and radially moves to the edge of wafer 5, the voltage increases since additional energy is required by the motor to continue rotating wafer 5 at a constant speed with the added downforce of brush 12.

The above invention achieves the objects recited above. Given the inability of a tool user to actually watch the brush cleaning cycle, the silent failure of the DNS brush cleaner is overcome with the present invention using the torque on the wafer as a guide to detecting the presence of the brush cleaner during post-CMP processing. The ability to detect the presence of the brush ensures proper wafer cleaning. The torque values also eliminate any guess work as to setting the proper downforce on the wafers. Individual wafers which are not cleaned can be detected immediately rather than at the end of a queue so that entire wafer lots need not be redone. Problems associated with the inadequate removal of CMP residue are detected prior to an inspection point later on in the manufacturing process. This reduces rework and lowers manufacturing costs.

While the present invention has been particularly described, in conjunction with a specific preferred embodiment, it is evident that many alternatives, modifications and variations will be apparent to those skilled in the art in Light of the foregoing description. It is therefore contemplated that the appended claims will embrace any such alternatives, modifications and variations as falling within the true scope and spirit of the present invention.

Thus, having described the invention, what is claimed is:

1. A semiconductor wafer cleaning tool comprising:
   a cleaning chamber;
   a rotatable fixture within said cleaning chamber for securing and rotating a semiconductor wafer during cleaning;
   a brush cleaner within said cleaning chamber for cleaning a surface of the rotating wafer, said cleaner developing a torque with said fixture during contact with the wafer; and
   a means for detecting the presence of said brush cleaner using the torque developed with said fixture during the wafer cleaning.

2. The tool according to claim 1, wherein said brush cleaner comprises
   a rotating brush; and
   a brush arm adapted to move said rotating brush across the surface of said rotating wafer.

3. The tool according to claim 1, further including a servo motor for rotating said rotatable fixture.

4. The tool according to claim 3, further including a servo controller electrically connected to said servo motor.

5. The tool according to claim 1, wherein said detecting means comprises a voltage sensor linked to a servo controller to display the voltage of a servo motor.

6. The tool according to claim 5, wherein said voltage sensor is adapted to determine the presence of said brush cleaner on said rotating wafer during cleaning of said wafer.

7. A post-CMP cleaning tool comprising:
   a cleaning chamber;
   a rotatable semiconductor wafer fixture within said cleaning chamber for securing and rotating a wafer during cleaning;
   a motor linked to said rotatable fixture for rotating said fixture;
   a motor controller linked to said motor;
   a brush cleaner within said chamber having a rotating brush, and a brush arm adapted to move said rotating brush across a surface of a rotating wafer;
   a torque monitor linked to said motor controller for detecting the presence of said brush cleaner during wafer cleaning.

8. The tool according to claim 7, wherein said torque monitor calculates a torque on said rotating wafer.

9. The tool according to claim 7, wherein said torque monitor is adapted to determine the absence of said brush cleaner on said rotating wafer during cleaning of said wafer.

10. The tool according to claim 7, wherein said torque monitor is adapted to determine the absence of said brush cleaner on said rotating wafer during cleaning by calculating a torque on said rotating wafer when contacted with said brush cleaner, the torque being greater than a torque on said rotating wafer alone.

11. The tool according to claim 7, wherein said torque monitor signals said motor controller when the absence of said brush cleaner is determined, said motor controller sending a signal to said motor to cease rotating said fixture.

12. A semiconductor wafer cleaning tool comprising:
    a cleaning chamber;
    a rotatable fixture within said cleaning chamber for securing and rotating a semiconductor wafer during cleaning;
    a servo motor for rotating said rotatable fixture;
    a servo controller electrically connected to said servo motor, said servo controller interfacing with a processor such that said processor is adapted to detect the absence of said brush cleaner and convey such to a tool user based on an output of said servo controller
    a brush cleaner within said cleaning chamber for cleaning a surface of the wafer; and
    a means for detecting the presence of said brush cleaner during wafer cleaning.

13. A semiconductor wafer cleaning tool comprising:
    a cleaning chamber;
    a rotatable fixture within said cleaning chamber for securing and rotating a semiconductor wafer during cleaning;
    a servo motor for rotating said rotatable fixture;
    a servo controller electrically connected to said servo motor
    a brush cleaner within said cleaning chamber for cleaning a surface of the wafer; and
    a torque monitor linked to said servo controller to calculate a torque on said rotating wafer for detecting the presence of said brush cleaner during wafer cleaning.

14. The tool according to claim 13, wherein said torque monitor is adapted to determine the presence of said brush cleaner on said rotating wafer during cleaning of said wafer.

15. The tool according to claim 13, wherein said torque monitor is adapted to determine the presence of said brush cleaner on said rotating wafer during cleaning by calculating a torque on said rotating wafer when contacted with said brush cleaner, the torque being greater than a torque on said rotating wafer alone.

16. The tool according to claim 13, wherein said torque monitor sends a signal to said servo controller when the torque on said rotating wafer when contacted with said brush cleaner is substantially equal to the torque on said rotating wafer alone, and said servo controller sends a signal to said servo motor to cease rotating said rotatable fixture.

17. The tool according to claim 13, wherein said servo controller sends an analog signal to said torque monitor, said analog signal is converted to a digital signal by said torque monitor.

* * * * *